US012796474B2

(12) United States Patent
Jeong et al.

(10) Patent No.: US 12,796,474 B2

(45) Date of Patent: Nov. 10, 2026

(54) SEMICONDUCTOR PACKAGE MANUFACTURING METHOD AND A BONDING DEVICE FOR MANUFACTURING A SEMICONDUCTOR PACKAGE

(71) Applicant: SAMSUNG ELECTRONICS CO., LTD., Suwon-si (KR)

(72) Inventors: Sanghyeon Jeong, Suwon-si (KR); Youngja Kim, Suwon-si (KR); Junga Lee, Suwon-si (KR); Donguk Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 438 days.

(21) Appl. No.: 18/470,082

(22) Filed: Sep. 19, 2023

(65) Prior Publication Data

US 2024/0170448 A1 May 23, 2024

(30) Foreign Application Priority Data

Nov. 23, 2022 (KR) ........................ 10-2022-0158489
May 10, 2023 (KR) ........................ 10-2023-0060206

(51) Int. Cl.
*H10W 42/00* (2026.01)
*H10W 72/00* (2026.01)
*H10W 90/00* (2026.01)

(52) U.S. Cl.
CPC .... *H10W 42/121* (2026.01); *H10W 72/07236* (2026.01); *H10W 90/724* (2026.01)

(58) Field of Classification Search
None
See application file for complete search history.

(56) References Cited

U.S. PATENT DOCUMENTS

| | | | | |
|---|---|---|---|---|
| 5,425,491 | A * | 6/1995 | Tanaka | B23K 20/025 451/53 |
| 6,179,196 | B1 * | 1/2001 | Heim | B23K 1/012 228/6.1 |
| 6,460,755 | B1 * | 10/2002 | Inoue | B23K 3/0623 228/41 |
| 8,978,960 | B2 | 3/2015 | Brofman et al. | |
| 2006/0145719 | A1 | 7/2006 | Jeong et al. | |
| 2012/0217287 | A1 * | 8/2012 | Kumar | B23K 1/0016 228/232 |
| 2022/0102313 | A1 * | 3/2022 | Jeng | H10P 72/74 |

(Continued)

FOREIGN PATENT DOCUMENTS

| | | |
|---|---|---|
| JP | 4064808 | 3/2008 |
| JP | 4616793 82 | 1/2011 |

(Continued)

*Primary Examiner* — Nduka E Ojeh

(74) *Attorney, Agent, or Firm* — Morgan, Lewis & Bockius LLP

(57) ABSTRACT

A method of manufacturing a semiconductor package includes applying a plurality of forces to a plurality of points of a semiconductor chip through a plurality of elastic members, and bonding the semiconductor chip to an object while the plurality of forces are applied to the plurality of points of the semiconductor chip through the plurality of elastic members, wherein the plurality of elastic members are configured such that the plurality of forces are different from each other, and the plurality of forces flatten the semiconductor chip.

16 Claims, 11 Drawing Sheets

(56) References Cited

U.S. PATENT DOCUMENTS

| | | | | |
|---|---|---|---|---|
| 2023/0317675 | A1* | 10/2023 | Baker | H10W 72/0711<br>438/125 |
| 2024/0071982 | A1* | 2/2024 | Chen | H10W 72/011 |

FOREIGN PATENT DOCUMENTS

| | | |
|---|---|---|
| JP | 2017-092313 | 5/2017 |
| KR | 10-0466676 | 1/2005 |
| KR | 10-2006-0080426 | 7/2006 |
| KR | 10-2361472 | 2/2022 |

* cited by examiner

SEMICONDUCTOR PACKAGE MANUFACTURING METHOD AND A BONDING DEVICE FOR MANUFACTURING A SEMICONDUCTOR PACKAGE

CROSS-REFERENCE TO RELATED APPLICATION(S)

This application claims priority under 35 U.S.C. § 119 to Korean Patent Application Nos. 10-2022-0158489, filed on Nov. 23, 2022, and 10-2023-0060206, filed on May 10, 2023, in the Korean Intellectual Property Office, the disclosures of which are herein incorporated by reference in their entirety.

TECHNICAL FIELD

The present inventive concept relates to a method of manufacturing a semiconductor package and a bonding device for manufacturing a semiconductor package.

DESCRIPTION OF RELATED ART

In line with a trend towards miniaturized and high performance semiconductor packages, semiconductor chips of the semiconductor packages may also be miniaturized or thinned.

Typically, a semiconductor chip may be bonded to a package substrate, which may enable the semiconductor chip to exchange electrical signals with the package substrate. For example, the semiconductor chip may provide one or more functions (e.g., storage and operation) to the package substrate. A semiconductor chip, when bonded to a bonding target, such as a package substrate, may be warped by stress from an external force or heat. Warpage of the semiconductor chip may induce an internal stress in the semiconductor chip, and the stress may cause damage to the semiconductor chip or affect an electrical connection of the semiconductor chip to the bonding target. As semiconductor chips have been miniaturized and thinned, warpage of the semiconductor chips may be increasingly difficult to prevent.

SUMMARY

An aspect of the present inventive concept is to provide a method of manufacturing a semiconductor package capable of reducing or preventing warpage of a semiconductor chip and a bonding device for manufacturing a semiconductor package including the semiconductor chip, wherein the semiconductor chip may be flattened using the bonding device.

According to an aspect of the present inventive concept, a method of manufacturing a semiconductor package includes applying a plurality of forces to a plurality of points of a semiconductor chip through a plurality of elastic members; and bonding the semiconductor chip to an object while the plurality of forces are applied to the plurality of points of the semiconductor chip through the plurality of elastic members, wherein the plurality of elastic members are configured such that the plurality of forces are different from each other, and the plurality of forces flatten the semiconductor chip.

According to another aspect of the present inventive concept, a method of manufacturing a semiconductor package includes: moving a plurality of elastic members toward a semiconductor chip; applying a plurality of forces to a plurality of points of the semiconductor chip through the plurality of elastic members; and bonding the semiconductor chip to an object while the plurality of forces are applied to the plurality of points of the semiconductor chip through the plurality of elastic members, wherein front end portions of the plurality of elastic members form a plane prior to contact with the semiconductor chip.

According to another aspect of the present inventive concept, a bonding device includes: a housing comprising a plurality of through-holes; a first plurality of elastic members fixed to the plurality of through-holes of the housing, respectively, wherein each of the first plurality of elastic members includes: a barrel fixed to one of the plurality of through-holes; a plunger moveably coupled to the barrel; and a compressive member at least partially accommodated by the barrel and disposed between the barrel and the plunger; and a heat generator disposed on an upper surface of the housing and thermally connected to the plurality of elastic members.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
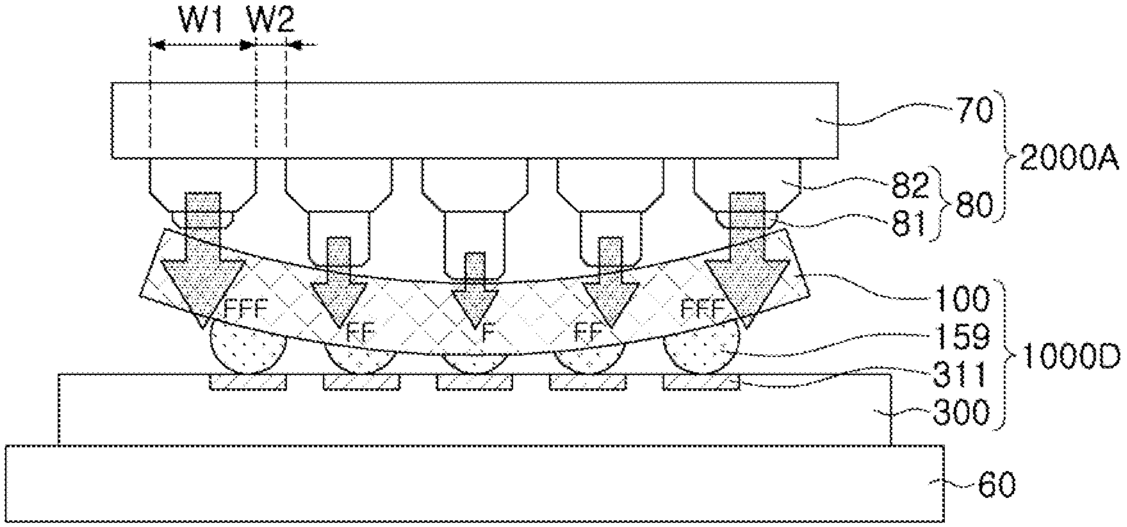
FIG. 1 is a cross-sectional view illustrating a bonding operation of a method of manufacturing a semiconductor package according to an embodiment of the present inventive concept.

In the following detailed description, reference is made to the accompanying drawings that show, by way of illustration, particular embodiments in which the invention may be practiced. Embodiments are described in sufficient detail to enable those skilled in the art to practice the invention. It is to be understood that various embodiments of the invention, although different, are not necessarily mutually exclusive. For example, a certain feature, structure, or characteristic described herein in connection with one embodiment may be implemented within other embodiments without departing from the spirit and scope of the invention. In addition, it is to be understood that the location or arrangement of individual elements within each embodiment may be modified without departing from the spirit and scope of the invention. The following detailed description is, therefore, not to be taken in a limiting sense, and the scope of the present inventive concept is defined only by the appended claims, appropriately interpreted, along with the full range of equivalents to which the claims are entitled. In the drawings, like numerals refer to the same or similar elements or functionality throughout the several views.

Hereinafter, embodiments will be described in detail with reference to the accompanying drawings so that they may be practiced by those skilled in the art to which the present inventive concept pertains.

Referring to FIG. 1, a method of manufacturing a semiconductor package according to an embodiment of the present inventive concept may include an operation of bonding a semiconductor chip 100 to a package substrate 300. The package substrate 300 may be an example of an object to be bonded (or a bonding target). The semiconductor chip 100 and the package substrate 300 may be bonded together by applying a plurality of forces F, FF, and FFF to a plurality of points of the semiconductor chip 100 through a plurality of elastic members 80. A semiconductor package 1000D may be manufactured by the bonding of the semiconductor chip 100 and the package substrate 300.

A bonding operation may include, for example, disposing a plurality of solder balls 159 between a front surface of the semiconductor chip 100 and a front surface the package substrate 300 by applying the plurality of forces F, FF, and FFF to the plurality of points on a rear surface of the semiconductor chip 100. The plurality of solder balls 159 may have, for example, a ball shape or column shape. The plurality of solder balls 159 may include a solder including tin (Sn) or an alloy (Sn—Ag—Cu) including tin (Sn). Since the plurality of solder balls 159 may have a relatively low melting point, as compared to other metal materials, the plurality of solder balls 159 may connect upper pads of the package substrate 300 to the semiconductor chip 100 and be fixed by, for example, a thermal compression bonding (TCB) process or a reflow process. 311.

The front surface and the rear surface of the semiconductor chip 100 may be opposite surfaces of the semiconductor chip 100. Further, the front surface and a rear surface of the package substrate 300 may be opposite surfaces of the package substrate 300. The front surface of the semiconductor chip 100 may face the front surface of the package substrate 300.

The plurality of elastic members 80 may be configured such that the plurality of forces F, FF, and FFF may be different from each other. The plurality of forces F, FF, and FFF applied by the plurality of elastic members 80 may reduce an internal force which may distort the semiconductor chip 100. For example, the plurality of forces F, FF, and FFF may include a strong force FFF, an intermediate force FF, and a weak force F.

Front end portions of the plurality of elastic members 80 may form a plane. For example, prior to contact with the semiconductor chip 100, the front end portions of the plurality of elastic members 80 may have substantially the same height and may form a plane. The plane may be a flat plane and may be different from a curved surface. When the plurality of elastic members 80 are moved toward the semiconductor chip 100, at least some of the plurality of elastic members 80 may initially contact the semiconductor chip 100 before other ones of the plurality of elastic members 80.

In a case where a center of the semiconductor chip 100 is curved downward, an edge of the rear surface of the semiconductor chip 100 may be higher than the center of the rear surface of the semiconductor chip 100. Therefore, when the plurality of elastic members 80 move toward the semiconductor chip 100 (e.g., downward in FIG. 1), the elastic members vertically overlapping the edge of the semiconductor chip 100 among the plurality of elastic members 80 may come into contact with the semiconductor chip 100 earlier than the elastic members vertically overlapping the center of the semiconductor chip 100 among the plurality of elastic members 80. The elastic members vertically overlapping the edge of the semiconductor chip 100 among the plurality of elastic members 80 may receive a relatively strong force from the semiconductor chip 100, a may provide a relatively strong elastic force to the semiconductor chip 100. This may be based on an application of Hook's Law in connection with the plurality of elastic members 80. Since the edge of the rear surface of the semiconductor chip 100 receives a stronger force than the center of the semiconductor chip 100, the edge of the rear surface of the semiconductor chip 100 may move downward more than the center of the semiconductor chip 100, and a difference in level between the edge of the rear surface of the semiconductor chip 100 and the center thereof may be reduced. Accordingly, an internal force warping the semiconductor chip 100 may be reduced, and the warpage of the semiconductor chip may be reduced or prevented. For example, the semiconductor chip 100 may be flattened.

In a case where the center of the semiconductor chip 100 is curved upward, the edge of the rear surface of the semiconductor chip 100 may be located at a level lower than the center of the rear surface. When the plurality of elastic members 80 are moved downward toward the semiconductor chip 100 (e.g., downward in FIG. 1), the elastic members vertically overlapping the edge of the semiconductor chip 100 among the plurality of elastic members 80 may come into contact with the semiconductor chip 100 later in time than the elastic members vertically overlapping the center of the semiconductor chip 100 among the plurality of elastic members 80 and the edge of the semiconductor chip 100 may receive a weaker force from the plurality of elastic members 80 than the center of the semiconductor chip 100. The application of the relatively weak force at the edge of the semiconductor chip 100 may be based on an application of Hook's Law in connection with the plurality of elastic members 80. In a case when the edge of the rear surface of the semiconductor chip 100 may be lower than the center of the rear surface, and the edge of the rear surface of the semiconductor chip 100 receives a weaker force than the center of the semiconductor chip 100, and a level difference between the edge of the rear surface of the semiconductor chip 100 and the center thereof may be reduced. Accordingly, an internal force warping the semiconductor chip 100 may be reduced, and warpage of the semiconductor chip may be reduced or prevented. For example, the semiconductor chip 100 may be flattened.

Referring to FIG. 1, FIG. 2, FIG. 3, FIG. 4, FIG. 5, FIG. 6, and FIG. 7, a bonding device 2000A may include the plurality of elastic members 80 and a housing 70. Each of the plurality of elastic members 80 may include a barrel 82, a compressive member 85, and a plunger 81. Each of the plurality of elastic members 80 may have a pin shape. The compressive member 85 may be, for example, a spring.

The housing 70 may be implemented as one or more jigs. For example, the housing 70 may fix the plurality of elastic members 80 in a line or in a matrix. For example, the housing 70 may fix the plurality of elastic members 80 in a matrix in horizontal directions (X-axis and Y-axis directions), such that the plungers 81 of the plurality of elastic members 80 form a plane in the horizontal directions. The plurality of elastic members 80 may be arranged in one or more housings 70 to have a size in the horizontal directions to cover one or more semiconductor chips, for example. The housing 70 may have high strength and be resistant to deformation due to heat. A portion of each of the plurality of elastic members 80 may be fixed to a plurality of through-holes 70H of the housing 70. For example, a portion of each of the plurality of elastic members 80 may be disposed in the plurality of through-holes 70H of the housing 70. The plurality of through-holes 70H may have different widths according to internal positions thereof. For example, the plurality of through-holes 70H may have a tapered width from a first side to a second side thereof. In another example, the plurality of through-holes 70H may have recesses or protrusions therein to fix the plurality of elastic members 80, or may fix the plurality of elastic members 80 through an adhesive material.

A barrel 82 of the plurality of elastic members 80 may be inserted into and fixed to one of the plurality of through-holes 70H of the housing 70. For example, a width W1 of the barrel 82 may be about 0.1 millimeter (mm) or more, and the plurality of elastic members 80 may have a same width. A distance W2 between adjacent barrels 82 may be greater than the maximum width W1 of the barrel 82. For example, the distance W2 may be greater than or equal to about 0.25 mm.

At least a portion of the compressive member 85 may be accommodated by the barrel 82. For example, an initial spring force of the compressive member 85 may be greater than about 0 gram-force (gf) and less than or equal to about 145 gf. The elastic force of the plurality of elastic members 80 may be the same or may be different depending on a design.

The plunger 81 may be moveably coupled to the barrel 82. The plunger 81 moveably coupled to the barrel 82 may capture the compressive member 85. The plunger 81 may have a narrower width than the barrel 82, and a portion of an outer surface of the plunger 81 and a portion of an inner surface of the barrel 82 may face each other.

Front end portions of the plungers 81 of the plurality of elastic members 80 may form a plane. For example, the plungers 81 may extend a same distance from the housing 70. The front end portions of the plungers 81 of the plurality of elastic members 80 may form a plane until at least some of the plurality of elastic members 80 start to contact the semiconductor chip 100 and one or more of the plungers 81 are depressed. For example, when the plunger 81 contacts the semiconductor chip 100 and receives a force from the semiconductor chip 100, the plunger 81 may be depressed into the barrel 82. At this time, the compressive member 85 may apply an elastic force through the plunger 81, and the elastic force may be transmitted to the semiconductor chip 100.

For example, each of the barrels 82, the compressive members 85, and the plungers 81 may include a metal (e.g., Au, Ni, Cu, Sn, or Zn) or a metal alloy. Accordingly, the plurality of elastic members 80 may provide difference elastic forces depending on small differences forces received by the plurality of elastic members 80 from the semiconductor chip 100. The plurality of forces F, FF, and FFF may be applied to a plurality of points of the semiconductor chip 100 as force is applied to the housing 70. For example, the force applied to the housing 70 may be at least partially transferred to the semiconductor chip 100 through the compressive members 85 and the plungers 81 of the plurality of elastic members 80. For example, the plurality of elastic members 80 may apply an elastic force to the semiconductor chip 100 when the plurality of elastic members 80 and the semiconductor chip 100 are moved to contact each other. In addition, the plurality of elastic members 80 may directly provide heat to the semiconductor chip 100 by using high thermal conductivity of metal or metal alloy.

Referring to FIG. 1, the package substrate 300 may be disposed on a carrier 60. The package substrate 300, which may be a bonding target, may be bonded to the semiconductor chip 100, while being disposed on the carrier 60. After bonding the semiconductor chip 100, the carrier 60 may be separated from the package substrate 300.

Figure 2:
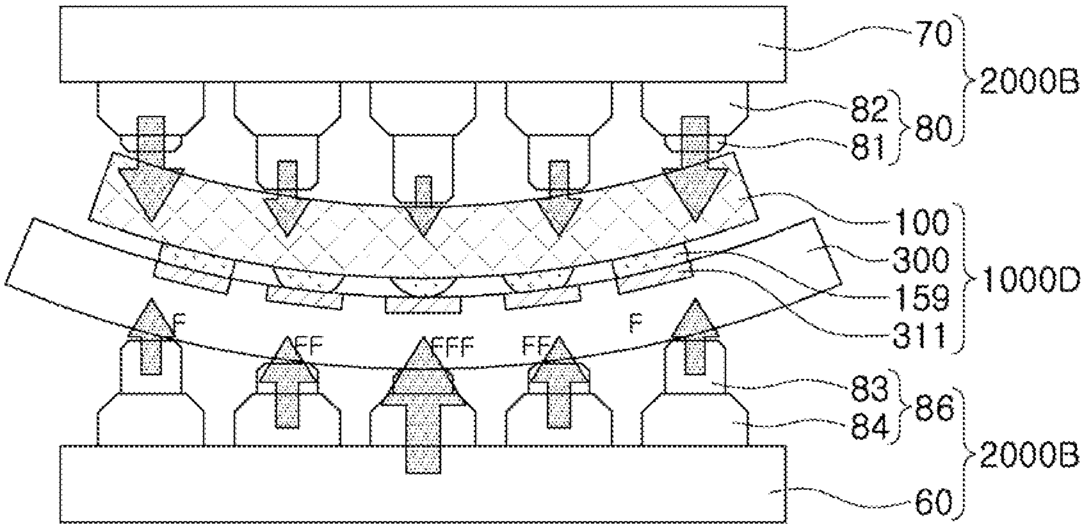
FIG. 2 is a cross-sectional view illustrating a method of manufacturing a semiconductor package and a plurality of second elastic members usable therefor according to an embodiment of the present inventive concept.

Referring to FIG. 2, a bonding operation of a method of manufacturing a semiconductor package according to an embodiment of the present inventive concept may include applying a plurality of second forces F, FF, and FFF to a plurality of points of the package substrate 300 through a plurality of second elastic members 86 using a bonding device 2000B. Each of the plurality of second elastic members 86 may include a second plunger 83, a second barrel 84, and a compressive member. The second elastic members 86, the second plunger 83, the second barrel 84, and the compressive member may be implemented in substantially the same manner as that of the plurality of elastic members 80, the plunger 81, the barrel 82, and the compressive member 85, respectively. Further, the carrier 60 may be implemented in substantially the same manner as that of the housing 70, and the plurality of second elastic members 86 may be inserted into and fixed to the plurality of through-holes of the carrier 60.

In a case where the center of the semiconductor chip 100 is curved downward, an edge of the front surface of the semiconductor chip 100 may be located at a level higher than the center of the front surface of the semiconductor chip 100. Further, a center of the package substrate 300 may be curved downward, an edge of the front surface of the package substrate 300 may be located at a level higher than the center of the front surface of the package substrate 300. When the plurality of second elastic members 86 are moved upward toward a rear surface the package substrate 300, the second plungers vertically overlapping the edge of the package substrate 300 among the plurality of second plungers 83 may come into contact with the package substrate 300 later in time than the second plungers 83 vertically overlapping the center of the package substrate 3000 among the plurality of second plungers 83 and the edge of the package substrate 300 may receive weaker force from the plurality of second elastic members 86 than a center of the package substrate 300. In a case when the center of the rear surface of the package substrate 300 may be lower than the edge of the rear surface, and the edge of the rear surface of the package substrate 300 receives a weaker force than the center, the center of the rear surface of the package substrate 300 may move upward more than the edge, and a difference in level between the edge of the rear surface of the package substrate 300 and the center thereof may be reduced. Further, forces applied to the package substrate 300 may be transmitted to the semiconductor chip 100, and a difference in level between the edge of the front surface of the semiconductor chip 100 and the center thereof may be reduced. Accordingly, an internal force of warping the semiconductor chip 100 may be reduced, and warpage of the semiconductor chip 100 may be more reduced or prevented. For example, the semiconductor chip 100 may be flattened.

Referring again to FIG. 2, the plurality of elastic members 80 may be disposed opposing the plurality of second elastic members 86, with the semiconductor chip 100 and the package substrate 300 disposed therebetween. In a bonding operation of a method of manufacturing a semiconductor package according to an embodiment of the present inventive concept, a plurality of forces F, FF, and FFF may be applied to a plurality of points of the semiconductor chip 100 through a plurality of elastic members 80 using a bonding device 2000B, and the plurality of second forces F, FF, and FFF may be applied to a plurality of points of the package substrate 300 through a plurality of second elastic members 86 using the bonding device 2000B. For example, forces may be applied downward of the semiconductor chip 100 and upward on the package substrate 300. Accordingly, an internal force of warping the semiconductor chip 100 and the package substrate 300 may be reduced, and warpage of the semiconductor chip 100 and the package substrate 300 may be more reduced or prevented. For example, the semiconductor chip 100 and the package substrate 300 may be flattened.

Figure 3:
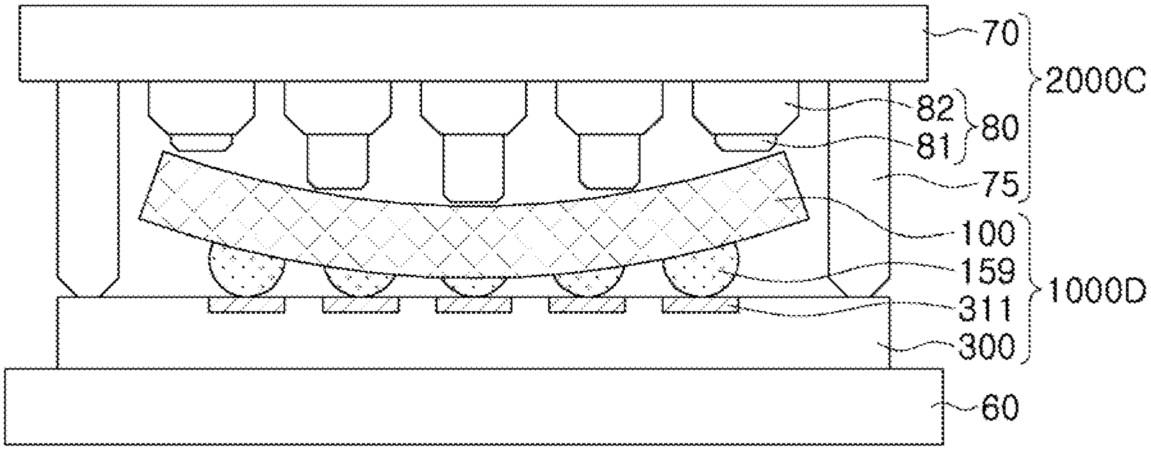
FIG. 3 is a cross-sectional view illustrating a method of manufacturing a semiconductor package and a support that may be used therefor according to an embodiment of the present inventive concept.

Referring to FIG. 3, in a bonding operation of a method of manufacturing a semiconductor package according to an embodiment of the present inventive concept, a plurality of forces may be applied by the plurality of elastic members 80 in a state in which a support 75 is connected between the housing 70 and the package substrate 300. A bonding device 2000C for performing the bonding operation may include the housing 70, the support 75, and the plurality of elastic members 80.

Accordingly, since a distance between the housing 70 and the package substrate 300 may be determined by the support 75, an average value of elastic forces applied to the semiconductor chip 100 by the plurality of elastic members 80 may also be determined based on the support 75. For example, the average value of the elastic forces applied to the semiconductor chip 100 by the plurality of elastic members 80 may be controlled by a height of the support 75, and an efficiency of reducing the warpage of the semiconductor chip 100 may be high. For example, the support 75 may have a column shape or a wall shape extending from the housing 70, and may include the same material as that of the housing 70. The support 75 may be part of the housing 70. For example, the support 75 and the housing 70 may be a unitary component.

Alternatively, the support 75 may be part of a process chamber in a method of supplying heat with a vapor phase soldering method, and heat in the process chamber may be evenly distributed to reduce a temperature difference between the plurality of solder balls 159. For example, the support 75 may form a side wall of the process chamber.

Figure 4:
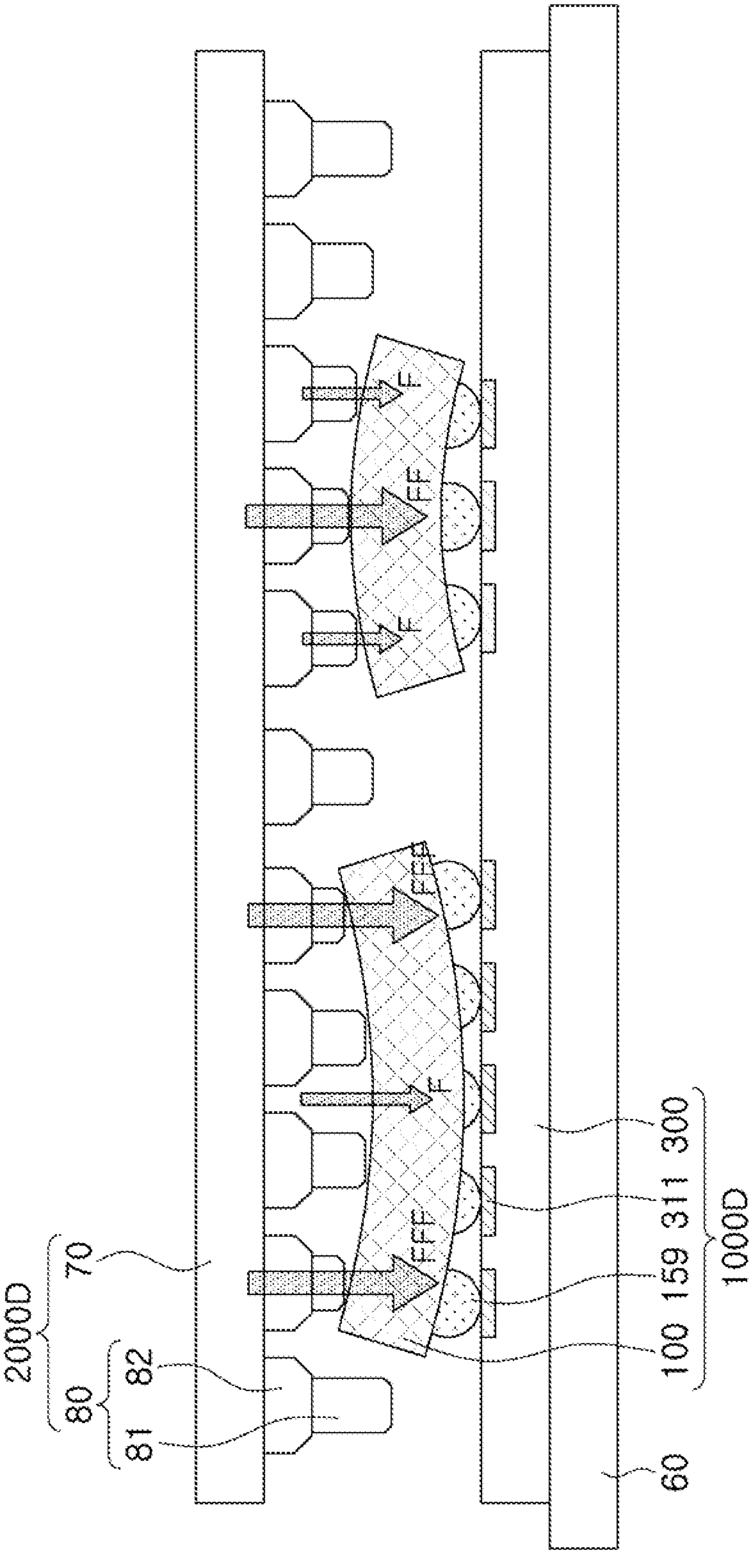
FIG. 4 is a cross-sectional view illustrating collective bonding of a plurality of semiconductor chips in a method of manufacturing a semiconductor package according to an embodiment of the present inventive concept.

Referring to FIG. 4, in a bonding operation of a method of manufacturing a semiconductor package according to an embodiment of the present inventive concept, a plurality of semiconductor chips 100 may be collectively bonded to the package substrate 300 using a bonding device 2000D. For example, the plurality of semiconductor chips 100 may be simultaneously bonded to the package substrate 300 using the bonding device 2000D.

Figure 5:
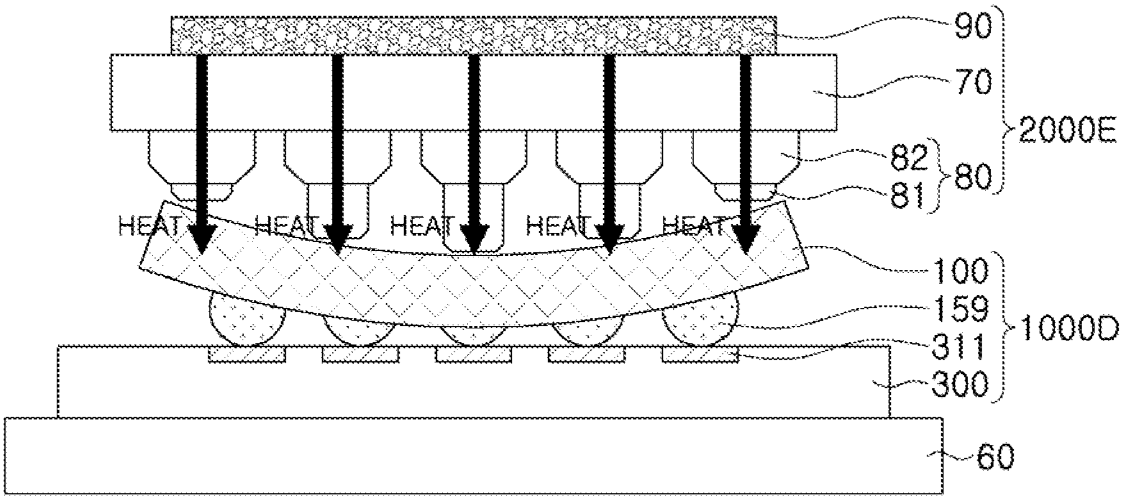
FIG. 5 is a cross-sectional view illustrating transmission of heat through a plurality of elastic members in a method of manufacturing a semiconductor package according to an embodiment of the present inventive concept.

Referring to FIG. 5, in a bonding operation of a method of manufacturing a semiconductor package according to an embodiment of the present inventive concept, heat HEAT may be transmitted to a plurality of points of the semiconductor chip 100 through a plurality of elastic members 80 using a bonding device 2000E. Using the bonding device 2000E, a temperature difference between the plurality of solder balls 159 may be reduced, bonding reliability (e.g., solder ball breakage prevention performance and electrical short circuit prevention performance) of the semiconductor package 1000D may be improved. For example, a heat generator 90 may be thermally connected to the plurality of elastic members 80. The heat generator 90 may be, for example, disposed on an upper surface of the housing 70 and may conduct heat to the plurality of solder balls 159 through the plurality of elastic members 80.

Figure 6:
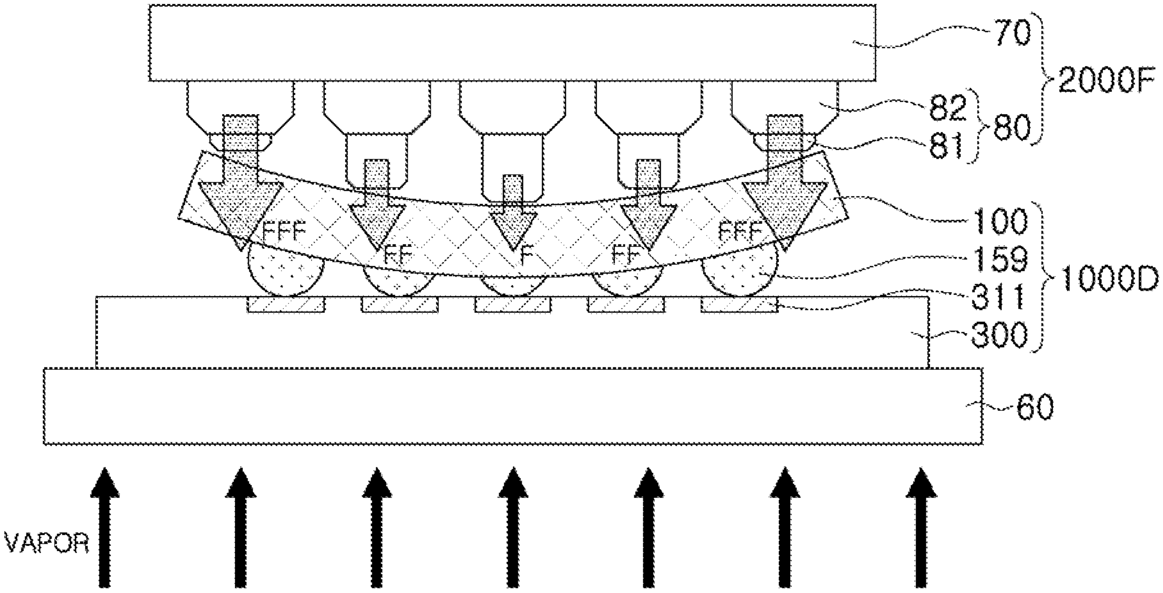
FIG. 6 is a cross-sectional view illustrating transmission of heat using a vapor phase soldering method in a method of manufacturing a semiconductor package according to an embodiment of the present inventive concept.
Figure 7:
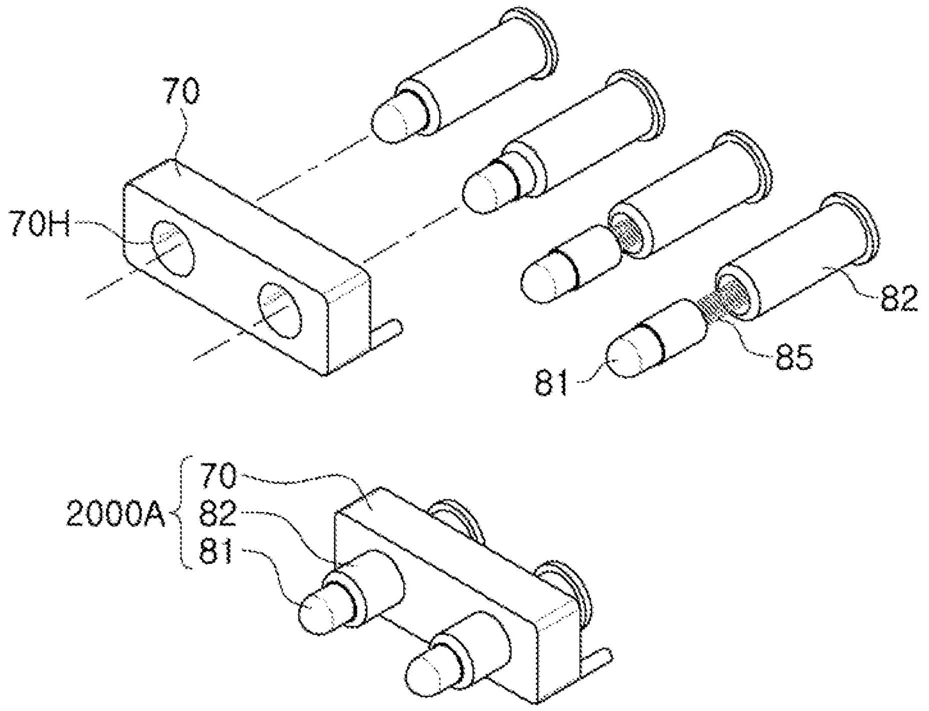
FIG. 7 is a perspective view illustrating a plurality of elastic members and a housing that may be used in a method of manufacturing a semiconductor package according to an embodiment of the present inventive concept.

Referring to FIG. 6, a bonding operation of a method of manufacturing a semiconductor package according to an embodiment of the present inventive concept may further include bonding the semiconductor chip 100 to the package substrate 300 by vapor phase soldering using a bonding device 2000F. For example, heat may be transferred from a vapor layer VAPOR at a lower side to an upper side of the package substrate 300 and the plurality of solder balls 159. In some example, the support 75 of FIG. 3 may be added to FIG. 6 as a chamber. In another example, a heat generator 90 of FIG. 5 may be added to FIG. 6, and heat may be provided to the plurality of solder balls 159 simultaneously from the upper side and the lower side of the plurality of solder balls 159.

Figure 8:
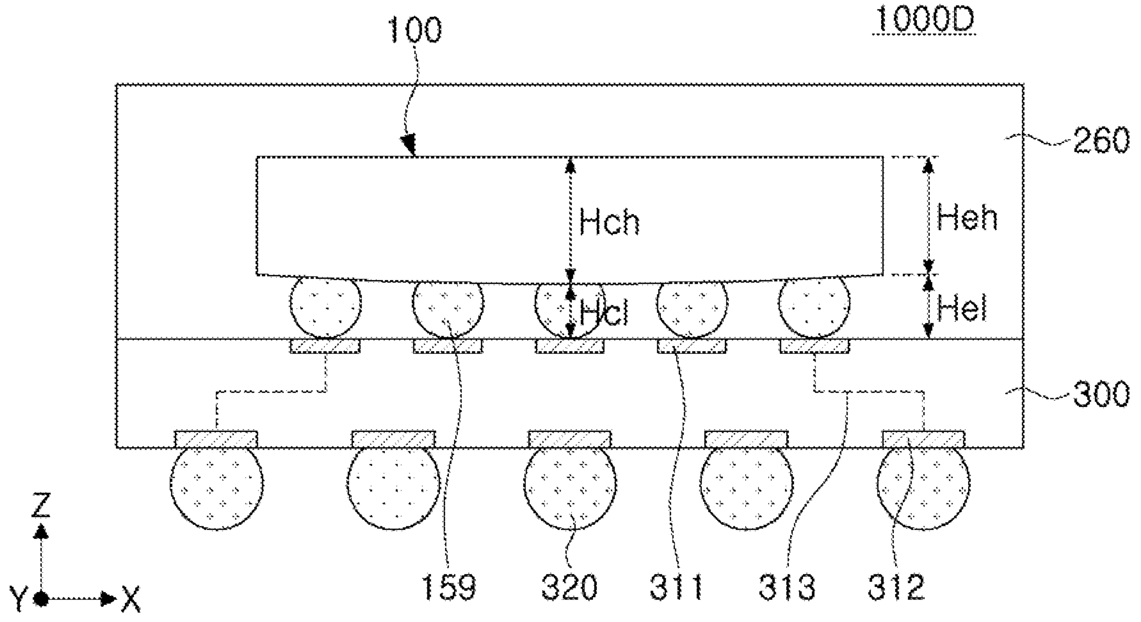
FIG. 8 is a cross-sectional view illustrating a thickness difference between portions of a semiconductor chip of a semiconductor package according to an embodiment of the present inventive concept.

Referring to FIG. 8, the semiconductor package 1000D according to an embodiment of the present inventive concept may include the semiconductor chip 100, the package substrate 300 disposed to face the front surface (e.g., a lower surface) of the semiconductor chip 100, and a plurality of solder balls 159 disposed between the semiconductor chip 100 and the package substrate 300. A thickness Hch between the center of the front surface and the center of the rear surface of the semiconductor chip 100 may be different than a thickness Heh between the edge of the front surface and the edge of the rear surface of the semiconductor chip 100.

For example, before the semiconductor chip 100 is bonded to the package substrate 300, the front surface and the rear surface of the semiconductor chip 100 may be curved in a same direction due to warpage. The rear surface (e.g., an upper surface) of the semiconductor chip 100 after the semiconductor chip 100 is bonded to the package substrate 300 may be flatter than the rear surface of the semiconductor chip 100 before the semiconductor chip 100 is bonded to the package substrate 300. While the rear surface (e.g., the upper surface) of the semiconductor chip 100 is flat, the front surface (e.g., the lower surface) of the semiconductor chip 100 may also be flat, and the front surface may be relatively less flat than the rear surface. Accordingly, the front surface (e.g., the lower surface) of the semiconductor chip 100 may be more curved than the rear surface (e.g., the upper surface) of the semiconductor chip 100. A difference in warpage between the front surface and the rear surface of the semiconductor chip 100 may increase as a temperature of the semiconductor chip 100 when the semiconductor chip 100 is bonded to the package substrate 300 increases, and a difference between the thickness Hch and the thickness Heh may also increase. When the plurality of elastic members 80 of FIG. 5 transfers heat HEAT to the plurality of points of the semiconductor chip 100, the difference in warpage between the front surface and rear surface of the semiconductor chip 100 may further increase and the difference between the thickness Hch and the thickness Heh may also increase. The difference between the thickness Hch and the thickness Heh may vary depending on the characteristics (e.g., strength) of the material included in the rear surface of the semiconductor chip 100, and there may be no substantial difference between the thickness Hch and the thickness Heh depending on the design.

A distance Hcl between the center of the front surface of the semiconductor chip 100 and the center of the upper surface of the package substrate 300 may also be different from a distance Hel between the edge of the front surface of the semiconductor chip 100 and the edge of the upper surface of the package substrate 300. In a case where the thickness Hch is greater than the thickness Heh, the distance Hcl may be shorter than the distance Hel. In a case where the thickness Hch is less than the thickness Heh, the distance Hcl may be greater than the distance Hel. In a case where the rear surface of the semiconductor chip 100 is substantially flat, the sum of the thickness Hch and the distance Hcl may be substantially equal to the sum of the thickness Heh and the distance Hel.

Figure 9:
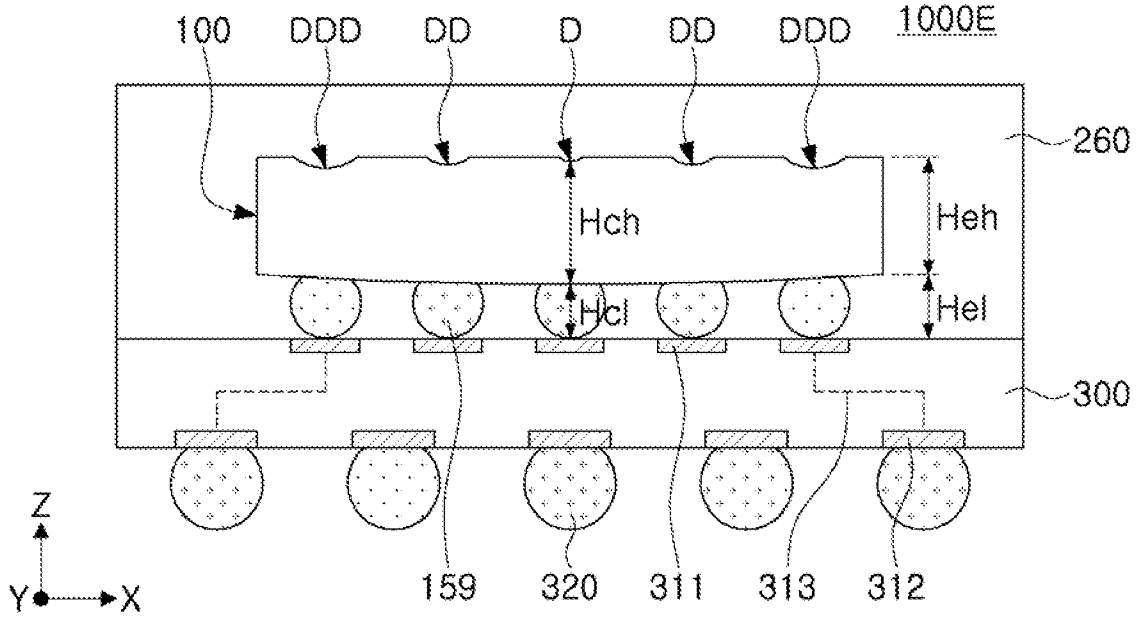
FIG. 9 is a cross-sectional view illustrating a plurality of recesses that may be formed on a rear surface of a semiconductor chip of a semiconductor package according to an embodiment of the present inventive concept.

Referring to FIG. 9, a rear surface of the semiconductor chip 100 of the semiconductor package 1000E according to an embodiment may have a plurality of fine recesses having different depths D, DD, and DDD. The different depths D, DD, and DDD may be based on different forces F, FF, and FFF of the plurality of elastic members 80 of FIG. 1. When the plurality of elastic members 80 of FIG. 5 transfer heat HEAT to a plurality of points of the semiconductor chip 100, a depth difference between the plurality of recesses may further increase. The depth difference between the plurality of recesses may vary depending on the characteristics (e.g., strength) of the material included in the rear surface of the semiconductor chip 100, and the plurality of recesses may not be formed depending on the characteristics (e.g., strength) of the material included in the rear surface of the semiconductor chip 100.

Figure 10:
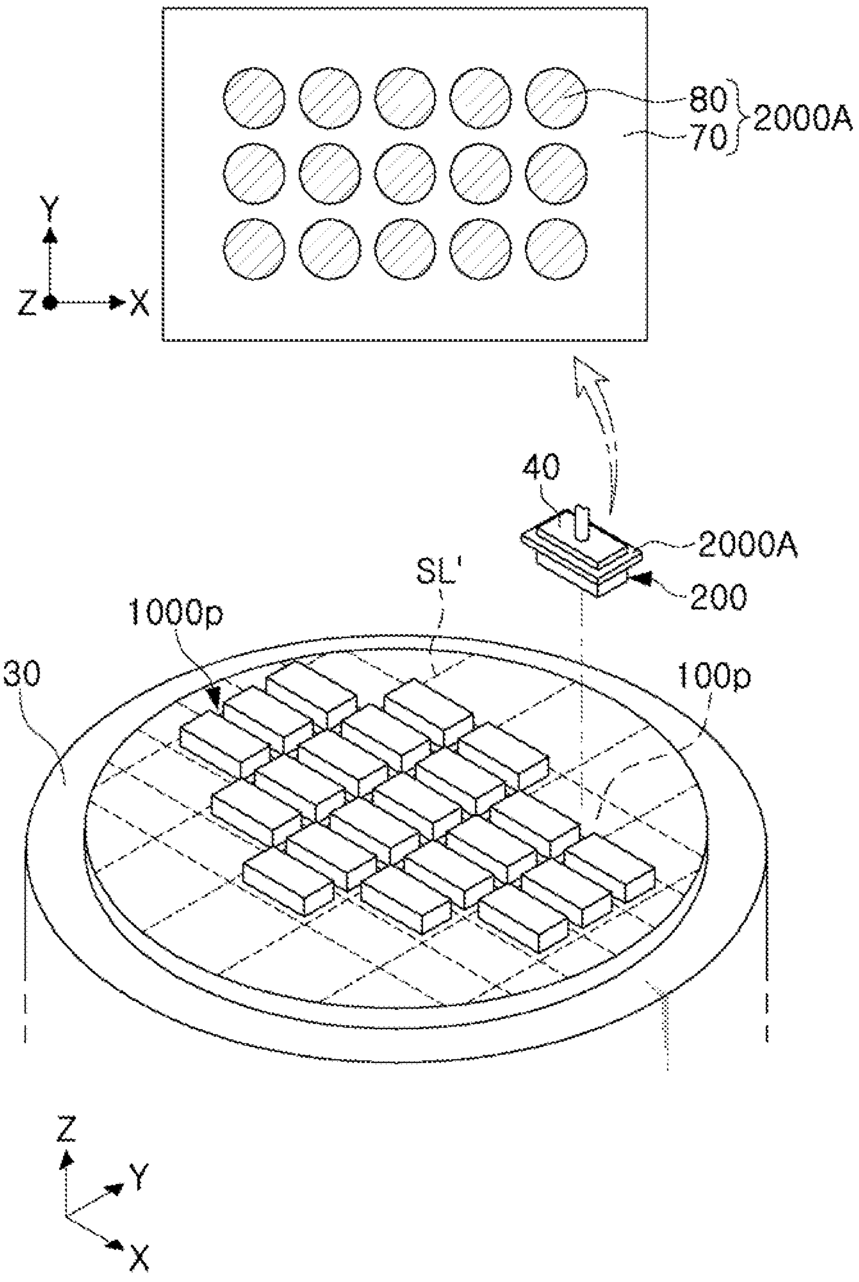
FIG. 10 is a perspective view and a plan view illustrating a method of manufacturing a semiconductor package according to an embodiment of the present inventive concept.

Referring to FIG. 10, a plurality of semiconductor structures 100*p* of a semiconductor package 1000*p* according to an embodiment of the present inventive concept may be disposed on an electrostatic chuck 30 in a combined state as a semiconductor wafer. The semiconductor wafer may be cut along scribe lines SL' and divided into a plurality of semiconductor structures 100*p*. The plurality of semiconductor chips 200 may be bonded to the plurality of semiconductor structures 100*p* by the bonding device 2000A, for example. The bonding device 2000A may be coupled to a pick-and-place device 40 and may receive a force from the pick-and-place device 40.

Figure 11:
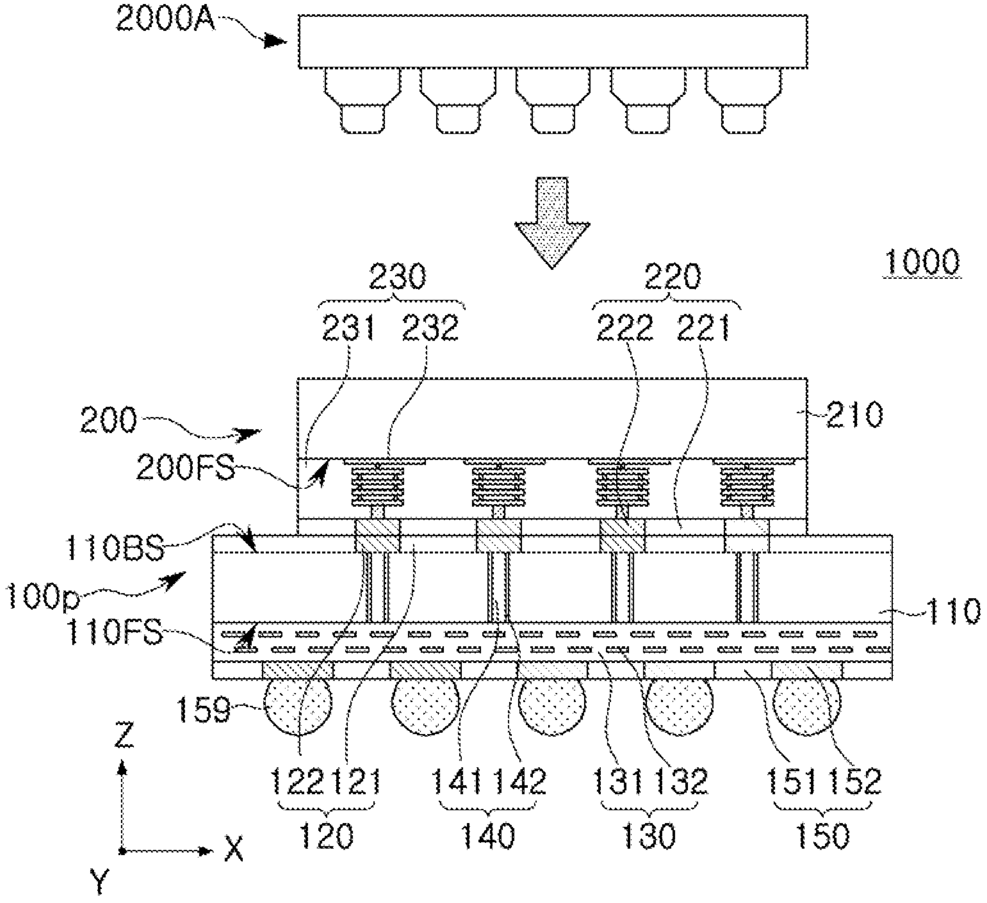
FIG. 11 is a cross-sectional view illustrating a semiconductor package according to an embodiment.

Referring to FIG. 11, a semiconductor package 1000 according to an embodiment may include a semiconductor structure 100*p* and a semiconductor chip 200 stacked in a vertical direction (a Z-axis direction). The bonding device 2000A may move downward to semiconductor package 1000 and may bond a structure in which the semiconductor structure 100*p* and the semiconductor chip 200 are coupled to a bonding target that may be disposed below the semiconductor structure 100*p*.

Elements exposed from an upper surface of the semiconductor structure 100*p* and a lower surface of the semiconductor chip 200 may be directly bonded (which may be referred to as hybrid bonding, direct bonding, or the like), without a separate connection member (e.g., metal pillar, solder bump, etc.). For example, dielectric-to-dielectric bonding and copper-to-copper bonding may be performed at an interface between the semiconductor structure 100*p* and the semiconductor chip 200. A first bonding structure 120 of the semiconductor structure 100*p* and a second bonding structure 220 of the semiconductor chip 200 may be bonded and coupled to each other.

The semiconductor structure 100*p* may be a semiconductor wafer-based structure, and may include a semiconductor layer 110, and a first bonding structure 120 as a 'rear cover layer', a circuit layer 130, a through-via 140, and a front cover layer 150. For example, the semiconductor structure 100*p* may be a silicon interposer substrate or a semiconductor chip. When the semiconductor structure 100*p* is a semiconductor chip, the semiconductor structure 100*p* and the semiconductor chip 200 stacked thereon may be chiplets forming a multi-chip module (MCM), but are not limited thereto.

The semiconductor layer 110 may include a semiconductor element, such as silicon or germanium, or a compound semiconductor, such as silicon carbide (SiC), gallium arsenide (GaAs), indium arsenide (InAs), or indium phosphide (InP). The semiconductor layer 110 may be part of a semiconductor wafer, and may be provided as an individual semiconductor layer 110 by cutting the semiconductor wafer.

The circuit layer 130 may be disposed on a front surface 110FS of the semiconductor layer 110 and may include an interlayer insulating layer 131 and an internal wiring 132. The interlayer insulating layer 131 may include at least one of silicon oxide, silicon nitride, or silicon oxynitride. The internal wiring 132 may be electrically connected to a rear pad 122 of the first bonding structure 120 or the through-via 140 disposed on a rear surface 110BS. The internal wiring 132 may be formed as a multilayer structure including a plurality of wiring lines and a plurality of wiring vias. Wiring lines and wiring vias may include, for example, aluminum (Al), gold (Au), cobalt (Co), copper (Cu), nickel (Ni), lead (Pb), tantalum (Ta), or tellurium (Te), titanium (Ti), tungsten (W), or a metal material including combinations thereof. A barrier film (not shown) including titanium (Ti), titanium nitride (TiN), tantalum (Ta), or tantalum nitride (TaN) may be disposed between the wiring line and/or wiring via and the interlayer insulating layer 131.

The first bonding structure 120 may be disposed on the rear surface 110BS of the semiconductor layer 110 and may include a rear insulating layer 121 as a 'first bonding insulating layer' and the rear pad 122 as a 'first bonding pad.' The rear insulating layer 121 and the front insulating layer 151 may include at least one of silicon oxide, silicon nitride, silicon oxynitride, silicon carbide, silicon oxycarbide, or silicon carbonitride. The rear pad 122 and the front pad 152 may include the aforementioned metal material similar to that of the internal wiring 132, but do not necessarily include the same type of metal material as that of the internal wiring 132. The rear insulating layer 121 may include an insulating material that may be combined with the second bonding insulating layer 221 of the semiconductor chip 200, for example, at least one of silicon oxide, silicon nitride, silicon oxynitride, silicon carbide, silicon oxycarbide, or silicon carbonitride. From a similar point of view, the rear pad 122 may be formed of a conductive material that may be combined with the second bonding pad 222 of the semiconductor chip 200, for example, at least one of copper (Cu), nickel (Ni), gold (Au), silver (Ag), or alloys thereof. The rear surface 110BS of the semiconductor layer 110 may be covered by a dielectric film (e.g., an Oxide-Nitride-Oxide (ONO) layer). The dielectric film may electrically insulate the rear pad 122 from a semiconductor material forming the semiconductor layer 110.

According to embodiments, the circuit layer 130 may be disposed on the front surface 110FS of the semiconductor layer 110 and may include individual elements (not shown) forming an integrated circuit. In this case, the internal wiring 132 may be electrically connected to the individual elements (not shown). The individual elements may include Field Effect Transistors (FETs), such as planar FETs and FinFETs, flash memories, memory devices, such as dynamic random-access memory (DRAM), static random-access memory (SRAM), electrically erasable programmable read-only memory (EEPROM), phase-change memory (PRAM), magnetoresistive random-access memory (MRAM), Ferroelectric RAM (FeRAM), or resistive random-access memory (RRAM), logic devices, such as AND, OR, or NOT, various active and/or passive devices, such as system LSI, CIS and microelectromechanical systems (MEMS).

The front cover layer 150 may be disposed below the circuit layer 130. The front cover layer 150 may include a front insulating layer 151 and a front pad 152. The front pad 152 may be electrically connected to the rear pad 122 through the internal wiring 132 and the through-via 140. The front pad 152 may provide a connection terminal through which the semiconductor structure 100*p* and the semiconductor chip 200 may be electrically connected to an external device. A separate connection member (e.g., a solder ball of the plurality of solder balls 159, a copper pillar, etc.) may be disposed below the front pad 152, but embodiments of the present inventive concept are not limited thereto. For example, the semiconductor structure 100*p* may be hybrid-bonded to another structure (e.g., a silicon interposer) without a connection member, such as a solder ball or the like.

The through-via 140 may pass through the semiconductor layer 110 and may be electrically connected to the internal wiring 132. The through-via 140 may be disposed to partially extend into the rear insulating layer 121 and the interlayer insulating layer 131 of the circuit layer 130. According to embodiments, the through-via 140 may electrically connect individual elements (not shown) disposed on the front surface 110FS of the semiconductor layer 110 to the internal wiring 132 through the internal wiring 132 of the circuit layer 130. The through-via 140 may include a through-electrode 141 and a barrier film 142 surrounding side surfaces of the through-electrode 141. The through-electrode 141 may include, for example, tungsten (W), titanium (Ti), aluminum (Al), or copper (Cu). The barrier film 142 may include a metal compound, such as tungsten nitride (WN), titanium nitride (TiN), or tantalum nitride (TaN). A via insulating film (not shown) may be formed on a side surface of the through-via 140. The via insulating film may be a monolayer or a multilayer film. The via insulating film may include silicon oxide, silicon oxynitride, silicon nitride, a polymer, or combinations thereof.

The semiconductor chip 200 may be stacked on the semiconductor structure 100*p* and may include a semiconductor layer 210, a circuit layer 230, and a second bonding structure 220. Although one semiconductor chip 200 is shown in the FIG. 11, the number of semiconductor chips 200 is not limited thereto in embodiments of the present inventive concept. For example, two or more semiconductor chips may be stacked on the semiconductor structure 100*p* in the vertical direction (the Z-axis direction) or arranged in horizontal directions (X-axis and Y-axis directions). The semiconductor layer 210 and the circuit layer 230 may have characteristics similar to those of the semiconductor layer 110 and the circuit layer 130 of the semiconductor structure 100*p*, and redundant descriptions thereof may be omitted.

Figure 12:
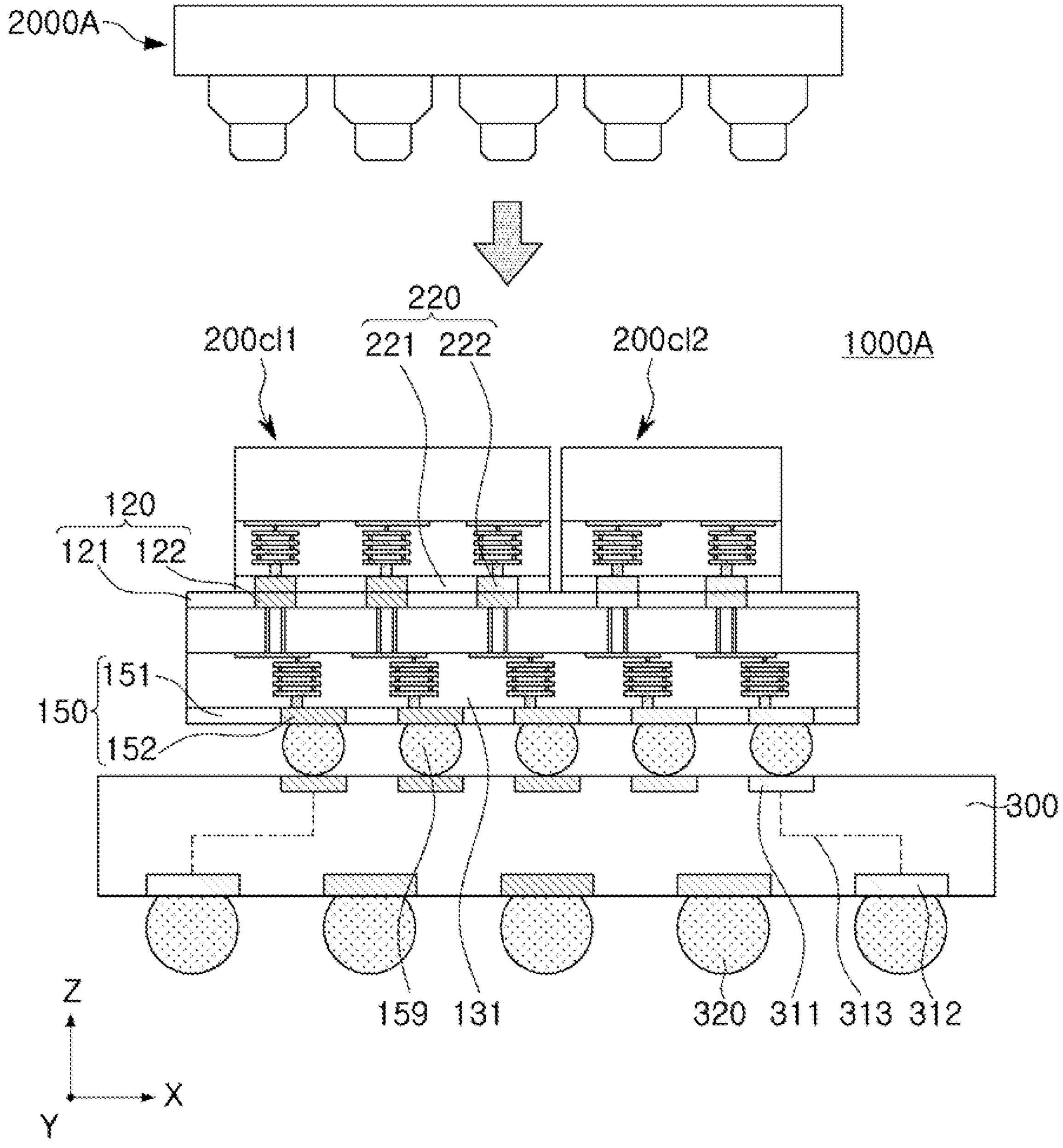
FIG. 12 is a cross-sectional view illustrating a semiconductor package according to an embodiment.

Referring to FIG. 12, a semiconductor package 1000A according to an embodiment of the present inventive concept may have characteristics the same as or similar to those described above with reference to FIG. 11, except that the semiconductor chip 200 may be provided as chiplets 200*c*11 and 200*c*12. The chiplets 200*c*11 and 200*c*12 may be arranged side by side on the semiconductor structure 100*p*. According to embodiments, the semiconductor structure 100*p* and the semiconductor chip 200 may be mounted on the package substrate 300. The bonding device 2000A may move downward to upper surfaces of the chiplets 200*c*11 and 200*c*12 to bond the structure, including the chiplets 200*c*11 and 200*c*12, to the package substrate 300.

The chiplets 200*c*11 and 200*c*12 may refer to each chip forming the MCM. The MCM may include I/O, CPU, GPU, FPGA chips, etc. The number of chiplets stacked on the semiconductor structure 100*p* is not particularly limited, and for example, two or less chiplets, or four or more chiplets, may be mounted on the semiconductor structure 100*p*. Here, the chiplet, or chiplet technology, may refer to a semiconductor chip manufactured separately according to a size and function of a device or a manufacturing technology such a semiconductor chip.

The semiconductor structure 100*p* may be, for example, an active interposer that performs a function of an I/O chip. The semiconductor structure 100*p* may include an I/O device, a DC/DC converter, a sensor, a test circuit, or the like therein. Accordingly, the chiplets 200*c*11 and 200*c*12 and the semiconductor structure 100*p* may form the MCM.

In the drawing, the semiconductor structure 100*p* may be mounted on the package substrate 300 through the connection member (e.g., the plurality of solder balls 159), but depending on a type (e.g., silicon substrate) of the package substrate 300, the front cover layer 150 may be hybrid bonded with the package substrate 300. In this case, since an edge portion of the front cover layer 150 may be cut through a manufacturing process of FIGS. 4 to 9, burrs formed on the front insulating layer 151 of the front cover layer 150 may be removed, and the front cover layer 150 may include a flat bonding surface without irregularities.

For example, the package substrate 300 may include a lower pad 312 disposed on a lower surface of a body, an upper pad 311 disposed on an upper surface of the body, and a redistribution circuit 313 electrically connecting the lower pad 312 to the upper pad 311. The package substrate 300 may be a substrate for a semiconductor package including a printed circuit board (PCB), a ceramic substrate, a glass substrate, a tape wiring board, or the like. The body of the package substrate 300 may include different materials depending on the type of substrate. For example, when the package substrate 300 is a PCB, the package substrate 300 may be formed by additionally stacking wiring layers on one or more surfaces of a body copper-clad laminate or a copper-clad laminate. Solder resist layers may be formed on the lower surface and the upper surface of the package substrate 300, respectively. The upper pad 311, the lower pad 312 and the redistribution circuit 313 may form an electrical path connecting the lower surface of the package substrate 300 to the upper surface of the package substrate 300. An external connection terminal 320 connected to the lower pad 312 may be disposed below the package substrate 300. The external connection terminal 320 may be formed of a conductive material having a shape, such as a ball or a pin.

Figure 13:
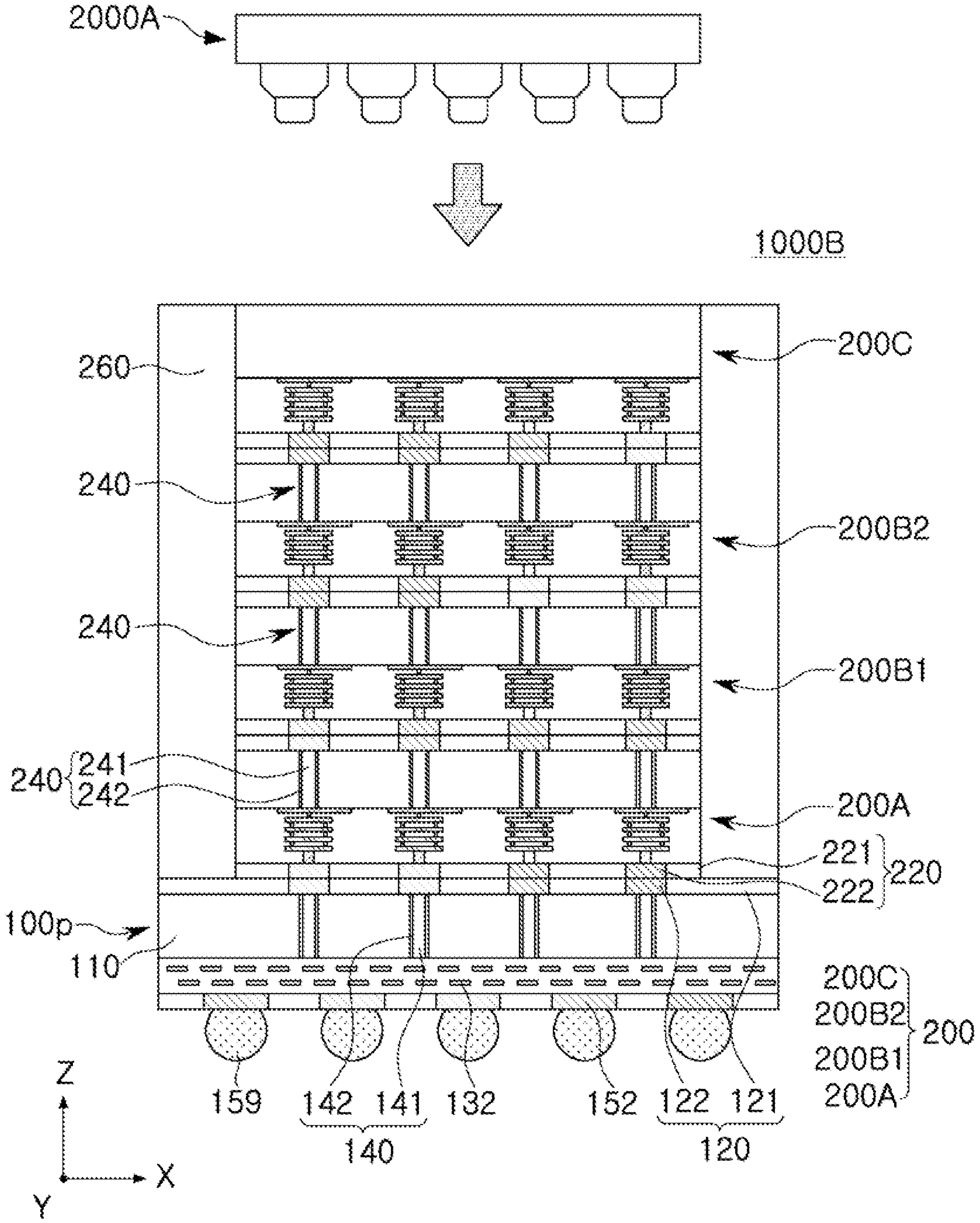
FIG. 13 is a cross-sectional view illustrating a semiconductor package according to an embodiment.

Referring to FIG. 13, a semiconductor package 1000B according to an embodiment of the present inventive concept may have characteristics similar to or the same as those described above with reference to FIGS. 10 to 12, except that the semiconductor chip on the semiconductor structure 100*p* may be provided as a plurality of semiconductor chips 200A, 200B1, 200B2, and 200C. The bonding device 2000A may move downward toward the semiconductor package 1000B to bond a structure including the plurality of semiconductor chips 200A, 200B1, 200B2, and 200C and the semiconductor structure 100*p* to a bonding target that may be disposed below the semiconductor structure 100*p*.

The semiconductor package 1000B may further include an encapsulant 260. The encapsulant 260 may cover the plurality of semiconductor chips 200A, 200B1, 200B2, and 200C. The encapsulant 260 may be disposed on the semiconductor structure 100*p*. The encapsulant 260 may expose an upper surface of a third semiconductor chip 200C, or may cover the upper surface of the third semiconductor chip 200C according to embodiments. The encapsulant 260 may include, for example, an epoxy molding compound (EMC), but the material of the encapsulant 260 is not particularly limited. The number of the plurality of semiconductor chips 200A, 200B1, 200B2, and 200C is not limited to that shown in the drawings, and may be two, three, or five or more.

The plurality of semiconductor chips 200A, 200B1, 200B2, and 200C may include a first semiconductor chip 200A attached to an upper surface of the semiconductor structure 100*p*, one or more second semiconductor chips 200B1 and 200B2 sequentially stacked on the first semiconductor chip 200A, and a third semiconductor chip 200C stacked on the second semiconductor chips 200B1 and 200B2. Each of the first to third semiconductor chips 200A, 200B1, 200B2, and 200C may include a structure similar to that of the second bonding structure 220, and a hybrid bonding structure may be formed between the first semiconductor chip 200A and the semiconductor structure 100*p* and between the second semiconductor chips 200B1 and 200B2 and the third semiconductor chip 200C. Since the second bonding structure 220 may be formed through a manufacturing process of FIGS. 4 to 9, burrs may be removed, and the second bonding structure may include a flat bonding surface without irregularities. The first semiconductor chip 200A and the second semiconductor chips 200B1 and 200B2 may further include a second through-via 240. The second through-via 240 may include a through-electrode 241 and a barrier film 242. Since the through-electrode 241 and the barrier film 242 of the second through-via 240 may have characteristics similar to those of the through-electrode 141 and the barrier film 142 of FIG. 11, redundant descriptions thereof may be omitted.

As an example, the semiconductor structure 100*p* may be a buffer chip including a plurality of logic devices and/or memory devices. Accordingly, the semiconductor structure 100*p* may transmit signals from the plurality of semiconductor chips 200A, 200B1, 200B2, and 200C stacked thereon externally, and also transmit signals and power from outside to the plurality of semiconductor chips 200A, 200B1, 200B2, and 200C. The semiconductor structure 100*p* may perform both a logic function and a memory function through logic devices and memory devices, or may include logic devices, without a memory device, and perform a logic function according to embodiments. The plurality of semiconductor chips 200A, 200B1, 200B2, and 200C may include, for example, volatile memory chips, such as DRAM or SRAM, or non-volatile memory chips, such as PRAM, MRAM, FeRAM, or RRAM. As an example, the semiconductor package 1000B may be used in a high bandwidth memory (HBM) product or an electro data processing (EDP) product.

Figure 14:
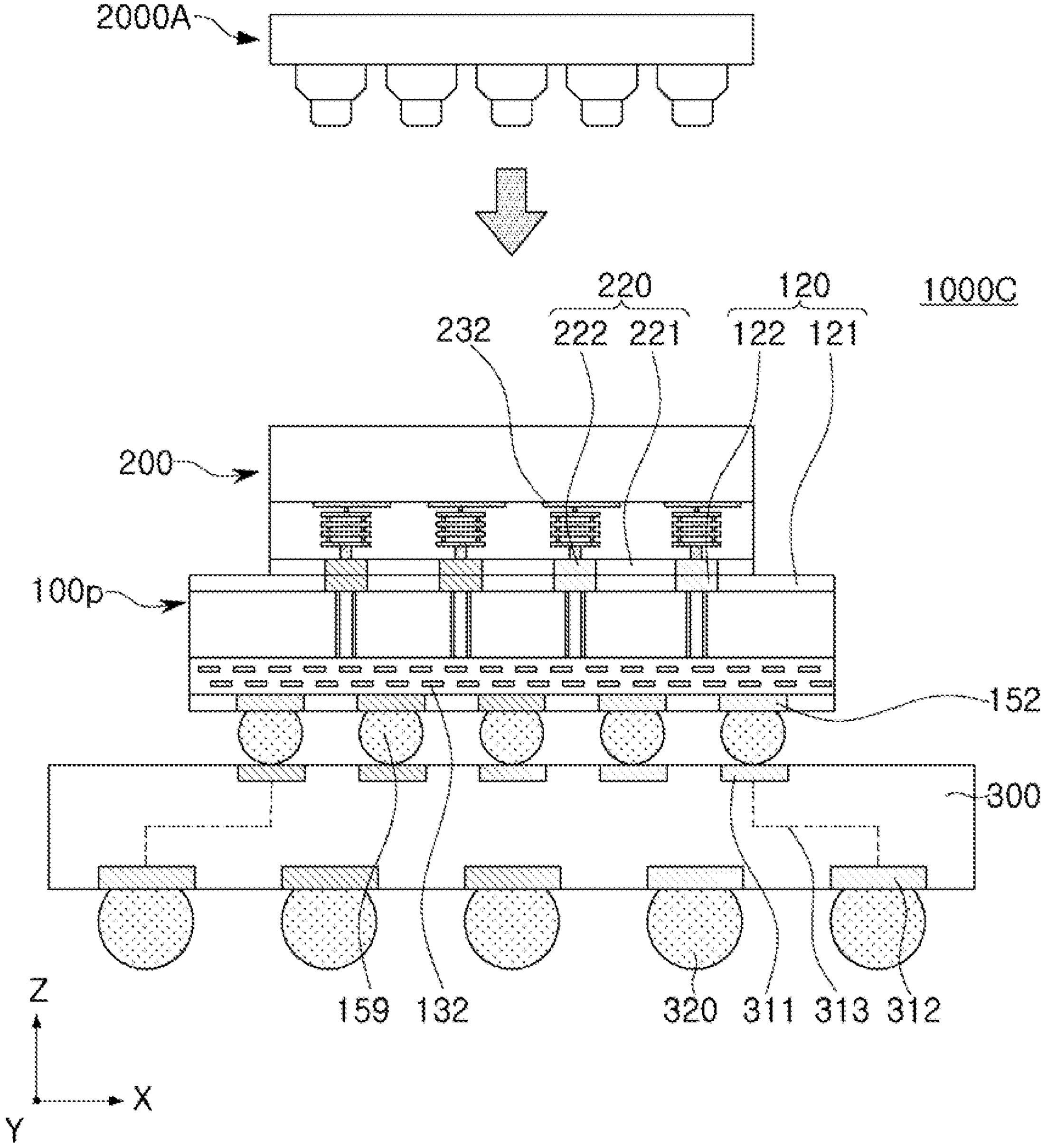
FIG. 14 is a cross-sectional view illustrating a semiconductor package according to an embodiment.

Referring to FIG. 14, a semiconductor package 1000C according to an embodiment of the present inventive concept may have characteristics similar to or the same as those described above with reference to FIG. 11, except that the semiconductor package 1000C according to an embodiment of the present inventive concept may include the package substrate 300 on which the semiconductor structure 100*p* may be mounted and an encapsulant 260 that may encapsulate the semiconductor structure 100*p* and the semiconductor chip 200 on the package substrate 300. The bonding device 2000A may move downward toward the semiconductor chip 200 to bond a structure including the semiconductor chip 200 and the semiconductor structure 100*p* to the package substrate 300.

As an example, the semiconductor structure 100*p* may be a logic chip including, for example, a central processing unit (CPU), a graphics processing unit (GPU), a field programmable gate array (FPGA), an application processor (AP), a digital signal processor (DSP), a cryptographic processor, a microprocessor, a microcontroller, an analog-to-digital converter, an application specific integrated circuits (ASIC), or the like. Also, the semiconductor chip 200 may include memory chips, such as DRAM, SRAM, PRAM, MRAM, FeRAM, or RRAM. In an embodiment, the semiconductor chip 200 may be the same as that of FIG. 11, but may have a shape similar to that described above with reference to FIGS. 12 to 14. For example, the semiconductor chip 200 may include a power management IC (PMIC) chip.

Methods of manufacturing a semiconductor package, and the semiconductor package according to an embodiment of the present inventive concept may reduce or prevent warpage of the semiconductor chip when bonding the semiconductor chip to an object to be bonded (or a package substrate), and the reliability (e.g., damage prevention performance, stability of electrical connection relationship) may be improved.

While example embodiments have been shown and described above, it will be apparent to those skilled in the art that modifications and variations could be made without departing from the scope of the present inventive concept as defined by the appended claims.

What is claimed is:

1. A method of manufacturing a semiconductor package, the method comprising:

applying a plurality of forces to a plurality of points of a semiconductor chip through a plurality of elastic members; and bonding the semiconductor chip to an object while the plurality of forces are applied to the plurality of points of the semiconductor chip through the plurality of elastic members, wherein the plurality of elastic members are configured such that the plurality of forces are different from each other, and the plurality of forces flatten the semiconductor chip.

2. The method of claim 1, wherein applying the plurality of forces to the plurality of points of the semiconductor chip through the plurality of elastic members comprises moving the plurality of elastic members into contact with the semiconductor chip, and wherein front end portions of the plurality of elastic members form a plane prior to contact with the semiconductor chip.

3. The method of claim 1, wherein the plurality of elastic members are fixed to a plurality of through-holes of a housing, respectively, and applying the plurality of forces to the plurality of points of the semiconductor chip through the plurality of elastic members comprises applying a force to the housing.

4. The method of claim 3, wherein each of the plurality of elastic members includes a barrel fixed to one of the plurality of through-holes, a plunger moveably coupled to the barrel, and a compressive member at least partially accommodated by the barrel and disposed between the barrel and the plunger, and wherein the force applied to the housing is at least partially transferred to the semiconductor chip through the compressive member and the plunger.

5. The method of claim 4, wherein a distance between the barrel and an adjacent barrel is greater than a maximum width of the barrel.

6. The method of claim 4, wherein each of the barrel, the compressive member, and the plunger includes a metal or a metal alloy.

7. The method of claim 3, wherein in the bonding of the semiconductor chip to the object, the plurality of forces are applied in a state in which a support is disposed between the housing and the object.

8. The method of claim 1, wherein the bonding of the semiconductor chip to the object further comprises applying a plurality of second forces to a plurality of points of the object through a plurality of second elastic members.

9. The method of claim 1, wherein the bonding of the semiconductor chip to the object further comprises connecting a plurality of solder balls between a front surface of the semiconductor chip and the object by applying the plurality of forces to the plurality of points on a rear surface of the semiconductor chip.

10. The method of claim 1, wherein the bonding of the semiconductor chip to the object further comprises transmitting heat to the plurality of points of the semiconductor chip through the plurality of elastic members.

11. The method of claim 1, wherein the bonding of the semiconductor chip to the object further comprises transmitting heat to the object by a vapor layer.

12. A method of manufacturing a semiconductor package, the method comprising:

moving a plurality of elastic members toward a semiconductor chip;

applying a plurality of forces to a plurality of points of the semiconductor chip through the plurality of elastic members; and bonding the semiconductor chip to an object while the plurality of forces are applied to the plurality of points of the semiconductor chip through the plurality of elastic members, wherein front end portions of the plurality of elastic members form a plane prior to contact with the semiconductor chip.

13. The method of claim 12, wherein the plurality of elastic members are fixed to a plurality of through-holes of a housing, respectively, and applying the plurality of forces to the plurality of points of the semiconductor chip through the plurality of elastic members comprises applying a force to the housing.

14. The method of claim 13, wherein each of the plurality of elastic members includes a barrel fixed to one of the plurality of through-holes, a plunger moveably coupled to the barrel, and a compressive member at least partially accommodated by the barrel and disposed between the barrel and the plunger, and wherein the force applied to the housing is at least partially transferred to the semiconductor chip through the compressive member and the plunger.

15. The method of claim 14, wherein the bonding of the semiconductor chip to the object further comprises transmitting heat to the plurality of points of the semiconductor chip through the plurality of elastic members.

16. The method of claim 14, wherein the bonding of the semiconductor chip to the object further comprises transmitting heat to the object by a vapor layer.

* * * * *